United States Patent
Qu et al.

(10) Patent No.: US 11,226,536 B2
(45) Date of Patent: Jan. 18, 2022

(54) WAVELENGTH CONVERSION SYSTEM AND PROCESSING METHOD

(71) Applicants: Gigaphoton Inc., Tochigi (JP); The University of Tokyo, Tokyo (JP)

(72) Inventors: Chen Qu, Oyama (JP); Yohei Kobayashi, Tokyo (JP); Zhigang Zhao, Tokyo (JP); Hironori Igarashi, Oyama (JP)

(73) Assignees: Gigaphoton Inc., Tochigi (JP); The University of Tokyo, Tokyo (JP)

( * ) Notice: Subject to any disclaimer, the term of this patent is extended or adjusted under 35 U.S.C. 154(b) by 0 days.

(21) Appl. No.: 16/987,972

(22) Filed: Aug. 7, 2020

(65) Prior Publication Data
US 2020/0363697 A1    Nov. 19, 2020

Related U.S. Application Data

(63) Continuation of application No. PCT/JP2018/012761, filed on Mar. 28, 2018.

(51) Int. Cl.
*G03B 27/54* (2006.01)
*G02F 1/35* (2006.01)
(Continued)

(52) U.S. Cl.
CPC .......... *G02F 1/3534* (2013.01); *G02F 1/3501* (2013.01); *G02F 1/3544* (2013.01);
(Continued)

(58) Field of Classification Search
CPC .... G02F 1/3501; G02F 1/3507; G02F 1/3534; G02F 1/3544; G02F 1/3551; G02F 1/37;
(Continued)

(56) References Cited

U.S. PATENT DOCUMENTS

2007/0263680 A1  11/2007  Starodoumov et al.
2009/0185583 A1*  7/2009  Kuksenkov ........... G02F 1/3532
                                                     372/5
(Continued)

FOREIGN PATENT DOCUMENTS

CN       106716247 B  *  5/2020  ........... H01S 3/1618
JP       H10-068976 A     3/1998
(Continued)

OTHER PUBLICATIONS

Machine translation of JP 2014-32277, Feb. 2014.*
(Continued)

*Primary Examiner* — Peter B Kim
(74) *Attorney, Agent, or Firm* — Studebaker & Brackett PC

(57) ABSTRACT

A wavelength conversion system including: A. a first nonlinear optical crystal to which first pulsed laser light having a first polarization state and a first wavelength and second pulsed laser light having a second polarization state and a second wavelength are inputted and which is configured to output in response to the input the second pulsed laser light and first sum frequency light having the second polarization state and a third wavelength produced by sum frequency mixing of the first wavelength with the second wavelength; and B. a second nonlinear optical crystal to which the first sum frequency light and the second pulsed laser light outputted from the first nonlinear optical crystal are inputted and which is configured to output in response to the input third pulsed laser light having a fourth wavelength.

20 Claims, 11 Drawing Sheets

(51) Int. Cl.
  *G02F 1/355* (2006.01)
  *G03F 7/20* (2006.01)
(52) U.S. Cl.
  CPC .......... *G02F 1/3551* (2013.01); *G03F 7/2006* (2013.01); *G03F 7/70025* (2013.01); *G03F 7/70041* (2013.01); *G02F 1/3507* (2021.01)
(58) Field of Classification Search
  CPC ............... G03F 7/2006; G03F 7/70025; G03F 7/70041; G03F 7/70566; G03F 7/70575; H01S 3/094
  See application file for complete search history.

(56) References Cited

U.S. PATENT DOCUMENTS

| | | |
|---|---|---|
| 2013/0188242 A1 | 7/2013 | Gapontsev et al. |
| 2017/0338617 A1 | 11/2017 | Zhao et al. |

FOREIGN PATENT DOCUMENTS

| | | |
|---|---|---|
| JP | 2001-051312 A | 2/2001 |
| JP | 2007-086108 A | 4/2007 |
| JP | 4925085 B2 | 4/2012 |
| JP | 2013-156448 A | 8/2013 |
| JP | 2014-032277 A | 2/2014 |
| WO | 2016/143071 A1 | 9/2016 |

OTHER PUBLICATIONS

Machine translation of JP 2013-156448, Aug. 2013.*
International Search Report issued in PCT/JP2018/012761; dated Dec. 6, 2018.
International Preliminary Report on Patentability and Written Opinion issued in PCT/JP2018/012761; dated Sep. 29, 2020.

* cited by examiner

Comparative Example

WAVELENGTH CONVERSION SYSTEM AND PROCESSING METHOD

CROSS-REFERENCE TO RELATED APPLICATIONS

The present application is a continuation application of International Application No. PCT/JP2018/012761, filed on Mar. 28, 2018, the entire contents of which are hereby incorporated by reference.

BACKGROUND

1. Technical Field

The present disclosure relates to a wavelength conversion system and a processing method.

2. Related Art

A semiconductor exposure apparatus is required to improve the resolution thereof as a semiconductor integrated circuit is increasingly miniaturized and highly integrated. The semiconductor exposure apparatus is hereinafter referred simply to as an "exposure apparatus." Reduction in the wavelength of the light outputted from alight source for exposure is therefore underway. A gas laser apparatus is used as the light source for exposure in place of a mercury lamp in related art. At present, a KrF excimer laser apparatus, which outputs ultraviolet light having a wavelength of 248 nm, and an ArF excimer laser apparatus, which outputs ultraviolet light having a wavelength of 193.4 nm, are used as the laser apparatus for exposure.

As a current exposure technology, liquid-immersion exposure, in which the gap between the exposure lens of the exposure apparatus and a wafer is filled with a liquid, has been put into use. In the liquid-immersion exposure, since the refractive index of the gap between the exposure lens and the wafer changes, the apparent wavelength of the light from the light source for exposure shortens. In the liquid-immersion exposure with an ArF excimer laser apparatus as the light source for exposure, the wafer is irradiated with ultraviolet light having an in-water wavelength of 134 nm. The technology described above is called ArF liquid-immersion exposure. The ArF liquid-immersion exposure is also called ArF liquid-immersion lithography.

Since KrF and ArF excimer laser apparatuses each have a wide spectral linewidth ranging from about 350 to 400 pm in spontaneous oscillation, the chromatic aberrations occur in association with the laser light (ultraviolet light) projected with the size thereof reduced onto the wafer via the projection lens of the exposure apparatus, resulting in a decrease in the resolution. To avoid the decrease in the resolution, the spectral linewidth of the laser light outputted from the gas laser apparatus needs to be narrow enough to make the chromatic aberrations negligible. To this end, a line narrowing module including a line narrowing element is provided in the laser resonator of the gas laser apparatus. The line narrowing module narrows the spectral linewidth. The line narrowing element may, for example, be an etalon or a grating. A laser apparatus having a narrowed spectral linewidth described above is called a narrowed-line laser apparatus.

CITATION LIST

Patent Literature

[PTL 1] Japanese Patent No. 4,925,085
[PTL 2] JP-A-10-68976
[PTL 3] JP-A-2001-51312

SUMMARY

A wavelength conversion system according to a viewpoint of the present disclosure includes:

A. a first nonlinear optical crystal to which first pulsed laser light having a first polarization state and a first wavelength and second pulsed laser light having a second polarization state and a second wavelength are inputted and which is configured to output in response to the input the second pulsed laser light and first sum frequency light having the second polarization state and a third wavelength produced by sum frequency mixing of the first wavelength with the second wavelength; and B. a second nonlinear optical crystal to which the first sum frequency light and the second pulsed laser light outputted from the first nonlinear optical crystal are inputted and which is configured to output in response to the input third pulsed laser light having a fourth wavelength.

A wavelength conversion system according to another viewpoint of the present disclosure includes:

A. a first nonlinear optical crystal to which first pulsed laser light having a first polarization state and a first wavelength and second pulsed laser light having the first polarization state and a second wavelength are inputted and which is configured to output in response to the input the second pulsed laser light and first sum frequency light having the second polarization state and a third wavelength produced by sum frequency mixing of the first wavelength with the second wavelength;

B. a wave plate to which the first sum frequency light and the second pulsed laser light outputted from the first nonlinear optical crystal are inputted and which is configured not to change the polarization state of the first sum frequency light but change the polarization state of the second pulsed laser light to the second polarization state; and C. a second nonlinear optical crystal to which the first sum frequency light and the second pulsed laser light having passed through the wave plate are inputted and which is configured to output in response to the input third pulsed laser light having a fourth wavelength.

A processing method according to another viewpoint of the present disclosure is a method for processing a workpiece, the method including exposing the workpiece to laser light outputted from a laser apparatus for exposure apparatus including either of the wavelength conversion systems.

BRIEF DESCRIPTION OF THE DRAWINGS

Embodiments of the present disclosure will be described below only by way of example with reference to the accompanying drawings.

DETAILED DESCRIPTION

Figure 1:
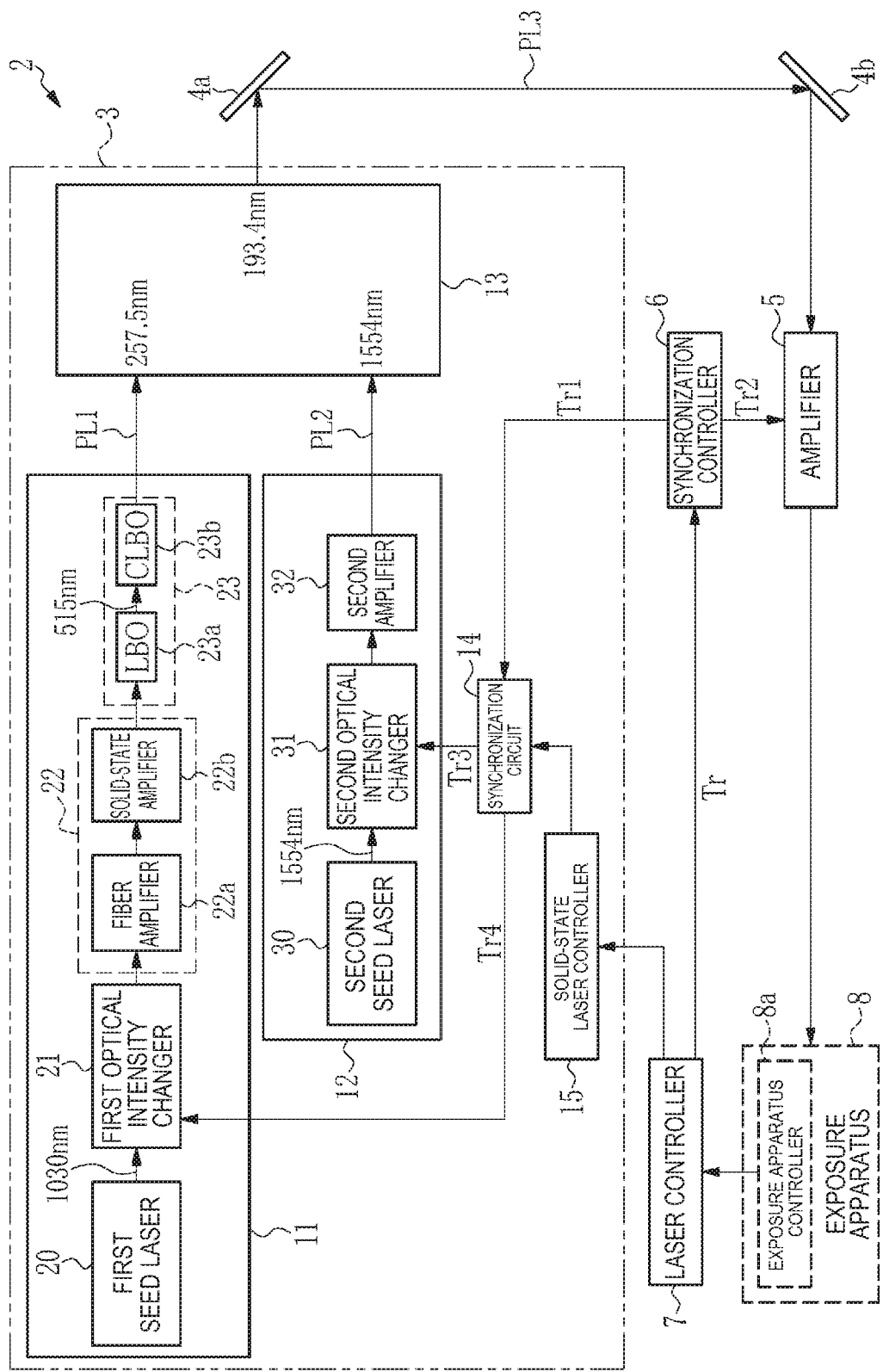
FIG. 1 schematically shows the configuration of a laser apparatus for exposure apparatus according to Comparison Example.

<Contents>
1. Comparison Example
1.1 Configuration
1.1.1 Overall configuration
1.1.2 Configuration of amplifier
1.2 Operation
1.3 Wavelength conversion system
1.3.1 Overall configuration
1.3.2 Configuration of CLBO crystals
1.3.3 Effects
1.4 Problems
2. First Embodiment
2.1 Overview configuration
2.2 Configuration of CLBO crystals
2.3 Effects
2.4 Advantages
3. Second Embodiment
3.1 Configuration
3.2 Effects
3.3 Advantages
4. Beam diameter
5. Wavelength adjustable range
6. Exposure apparatus Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Comparison Example 1.1 Configuration 1.1.1 Overall Configuration

FIG. 1 schematically shows the configuration of a laser apparatus 2 for exposure apparatus according to Comparison Example. The laser apparatus 2 for exposure apparatus includes a solid-state laser system 3, a first high reflectance mirror 4a, a second high reflectance mirror 4b, an amplifier 5, a synchronization controller 6, and a laser controller 7.

The solid-state laser system 3 includes a first solid-state laser apparatus 11, which outputs first pulsed laser light PL1, a second solid-state laser apparatus 12, which outputs second pulsed laser light PL2, a wavelength conversion system 13, a synchronization circuit 14, and a solid-state laser controller 15.

The first solid-state laser apparatus 11 includes a first seed laser 20, a first optical intensity changer 21, a first amplifier 22, and a wavelength converter 23. The first amplifier 22 includes a fiber amplifier 22a, a solid-state amplifier 22b, and a CW excitation semiconductor laser that is not shown. The wavelength converter 23 includes an LBO ($LiB_3O_5$) crystal 23a and a CLBO ($CsLiB_6O_{10}$) crystal 23b. The LBO crystal 23a and the CLBO crystal 23b are each a nonlinear optical crystal.

The first seed laser 20 is configured to output single-longitudinal-mode CW or pulsed light having a wavelength of about 1030 nm as first seed light. The first seed laser 20 is, for example, a distributed feedback semiconductor laser. The first optical intensity changer 21 includes a semiconductor device on which the first seed light is incident from the first seed laser 20. Owing to that pulse current is applied to the semiconductor device through a current controller that is not shown, the first optical intensity changer 21 converts the first seed light into laser light having a predetermined pulse width. The first seed light converted from the first optical intensity changer 21 is hereinafter referred to as first seed pulsed light.

The fiber amplifier 22a is formed of a plurality of quartz fibers to which Yb is doped and which are connected to each other for multi-stage amplification. The solid-state amplifier 22b is a YAG crystal to which Yb is doped. The fiber amplifier 22a and the solid-state amplifier 22b are optically excited with CW excitation light inputted from the excitation semiconductor laser that is not shown. The first amplifier 22 is configured to amplify the first seed pulsed light incident from the first optical intensity changer 21.

The wavelength converter 23 is configured to convert the amplified first seed pulsed light from the first amplifier 22 into harmonic light and output the harmonic light as the first pulsed laser light PL1. Specifically, the wavelength converter 23, which includes the LBO crystal 23a and the CLBO crystal 23b, is configured to produce fourth harmonic light having a wavelength of about 257.5 nm from the first seed pulsed light and output the fourth harmonic light as the first pulsed laser light PL1.

The second solid-state laser apparatus 12 includes a second seed laser 30, a second optical intensity changer 31, and a second amplifier 32. The second amplifier 32 includes an Er fiber amplifier that is not shown and is formed of a plurality of quartz fibers to which Er and Yb are doped and which are connected to each other for multi-stage amplification, and the second amplifier 32 further includes an excitation semiconductor laser that is not shown.

The second seed laser 30 is configured to output single-longitudinal-mode CW or pulsed light having a wavelength of about 1554 nm as second seed light. The second seed laser 30 is, for example, a distributed feedback semiconductor laser. The second optical intensity changer 31 includes a semiconductor device on which the second seed light is incident from the second seed laser 30. Owing to that pulse current is applied to the semiconductor device through a current controller that is not shown, the second optical intensity changer 31 converts the second seed light into laser light having a predetermined pulse width. The converted second seed light from the second optical intensity changer 31 is hereinafter referred to as second seed pulsed light.

The Er fiber amplifier provided in the second amplifier 32 is optically excited with CW excitation light inputted from the excitation semiconductor laser that is not shown. The second amplifier 32 is configured to amplify the second seed pulsed light incident from the second optical intensity changer 31. The second amplifier 32 is configured to output the amplified second seed pulsed light as the second pulsed laser light PL2.

The wavelength conversion system 13 is configured to produce third pulsed laser light PL3 based on the first pulsed laser light PL1 outputted from the first solid-state laser apparatus 11 and the second pulsed laser light PL2 outputted from the second solid-state laser apparatus 12 and output the third pulsed laser light PL3. The third pulsed laser light PL3 has the wavelength of about 193.4 nm.

The solid-state laser controller 15 is electrically connected to the first and second seed lasers 20, 30 and the CW excitation semiconductor lasers provided in the first and second amplifiers 22, 32 via signal lines that are not shown. The first high reflectance mirror 4a and the second high reflectance mirror 4b are so disposed that the pulsed laser light having the wavelength of about 193.4 nm enters the amplifier 5.

1.1.2 Configuration of Amplifier

Figure 2:
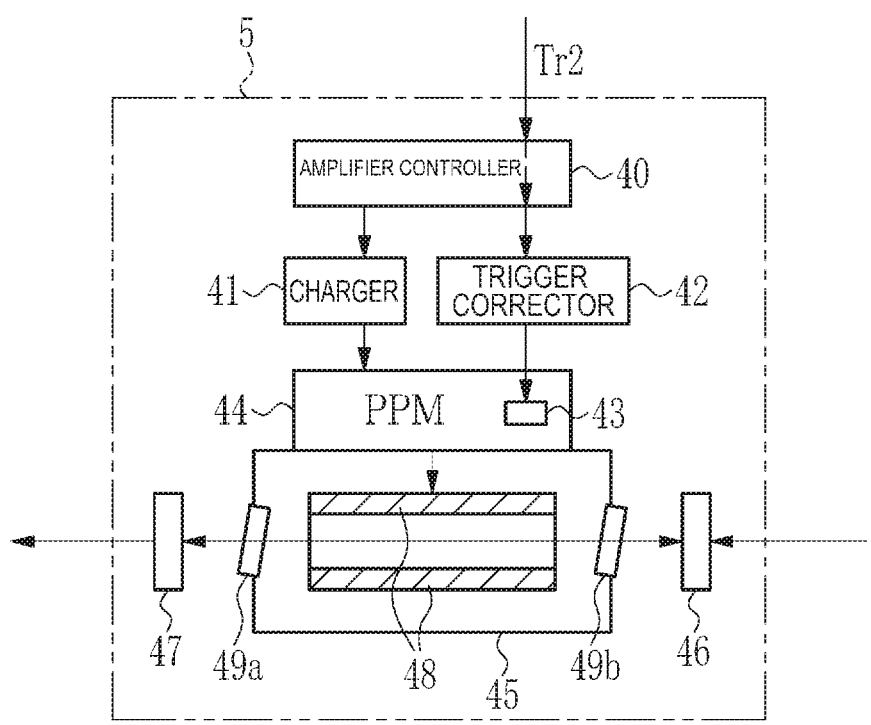
FIG. 2 schematically shows the configuration of an amplifier shown in FIG. 1.

FIG. 2 schematically shows the configuration of the amplifier 5 shown in FIG. 1. In FIG. 2, the amplifier 5 includes an amplifier controller 40, a charger 41, a trigger corrector 42, a pulse power module (PPM) 44 including a switch 43, a chamber 45, a partially reflective mirror 46, and an output coupling mirror 47.

The chamber 45 is provided with windows 49a and 49b. The chamber 45 encapsulates a laser gas containing, for example, an Ar gas, an $F_2$ gas, and an Ne gas. A pair of discharge electrodes 48 are disposed in the chamber 45. The pair of discharge electrodes 48 are connected to an output terminal of the PPM 44.

The amplifier 5 forms an optical resonator including the partially reflective mirror 46 and the output coupling mirror 47. The partially reflective mirror 46 is formed, for example, of a substrate which is made of a $CaF_2$ crystal, which transmits light having the wavelength of about 193.4 nm, and coated with a partially reflective film having a reflectance ranging from 70 to 90%. The output coupling mirror 47 is formed, of a substrate which is made of the $CaF_2$ crystal, which transmits light having the wavelength of about 193.4 nm, and coated with a partially reflective film having a reflectance ranging from 10 to 20%.

The amplifier 5 has been described with reference to the case where the optical resonator is a Fabry-Perot resonator by way of example, but not necessarily, and may be a ring resonator.

1.2 Operation

The operation of the laser apparatus 2 for exposure apparatus according to Comparative Example will next be described. The laser controller 7 causes the seed lasers to operate via the solid-state laser controller 15 to cause the excitation semiconductors laser that are not shown to achieve CW oscillation. The synchronization controller 6 receives data on delay between a first trigger signal Tr1 and a second trigger signal Tr2 from the solid-state laser controller 15. The synchronization controller 6 further receives an oscillation trigger Tr from an exposure apparatus 8 via the laser controller 7 and then controls the delay period between the first trigger signal Tr1 and the second trigger signal Tr2. Specifically, the synchronization controller 6 controls the delay period between the first trigger signal Tr1 and the second trigger signal Tr2 in such a way that discharge occurs in synchronization with injection of the third pulsed laser light PL3 outputted from the solid-state laser system 3 into the optical resonator of the amplifier 5.

The synchronization circuit 14 receives the first trigger signal Tr1 and then transmits control signals to the first and second optical intensity changers 21, 31. Upon reception of the control signal, the first optical intensity changer 21 amplifies the first seed light only for a predetermined period to produce the first seed pulsed light having the predetermined pulse width and causes the first seed pulsed light to enter the first amplifier 22. Similarly, upon reception of the control signal, the second optical intensity changer 31 amplifies the second seed light only for a predetermined period to produce the second seed pulsed light having the predetermined pulse width and causes the second seed pulsed light to enter the second amplifier 32.

Having entered the first and second amplifiers 22, 32, the first seed pulsed light and the second seed pulsed light are amplified by stimulated emission that occurs in the amplifiers. The first seed pulsed light amplified by the first amplifier 22 is incident on the wavelength converter 23. The first seed pulsed light having entered the wavelength converter 23 is converted into the fourth harmonic light, which is outputted as the first pulsed laser light PL1 from the first solid-state laser apparatus 11. On the other hand, the second seed pulsed light amplified by the second amplifier 32 is outputted as the second pulsed laser light PL2 from the second solid-state laser apparatus 12.

The first pulsed laser light PL1 outputted from the first solid-state laser apparatus 11 and the second pulsed laser light PL2 outputted from the second solid-state laser apparatus 12 enter the wavelength conversion system 13.

In this process, the delay data that causes the first pulsed laser light PL1 and the second pulsed laser light PL2 to be incident on a first CLBO crystal 50a, which will be described later, at substantially the same timing is transmitted from the solid-state laser controller 15 to the synchronization circuit 14. The synchronization circuit 14 transmits a third trigger signal Tr3 and a fourth trigger signal Tr4 to the first and second optical intensity changers 21, 31 at a predetermined timing based on the first trigger signal Tr.

As a result of the incidence of the first pulsed laser light PL1 and the second pulsed laser light PL2 on the first CLBO crystal 50a at substantially the same timing, the wavelength conversion system 13 outputs the third pulsed laser light PL3 having the wavelength of about 193.4 nm. The third pulsed laser light PL3 is reflected off the first and second high reflectance mirrors 4a, 4b at high reflectance and injected as the seed light into the resonator of the amplifier 5.

An inverted population is produced in the amplifier 5 in synchronization with the injection of the seed light. The trigger corrector 42 adjusts the timing at the switch 43 in the PPM to be turned on and off in such a way that the seed light is efficiently amplified by the amplifier 5. As a result, the optical resonator achieves amplification oscillation and outputs amplified pulsed laser light via the output coupling mirror 47. The pulsed laser light having the wavelength of about 193.4 nm then enters the exposure apparatus 8.

1.3 Wavelength Conversion System

1.3.1 Overall Configuration

Figure 3:
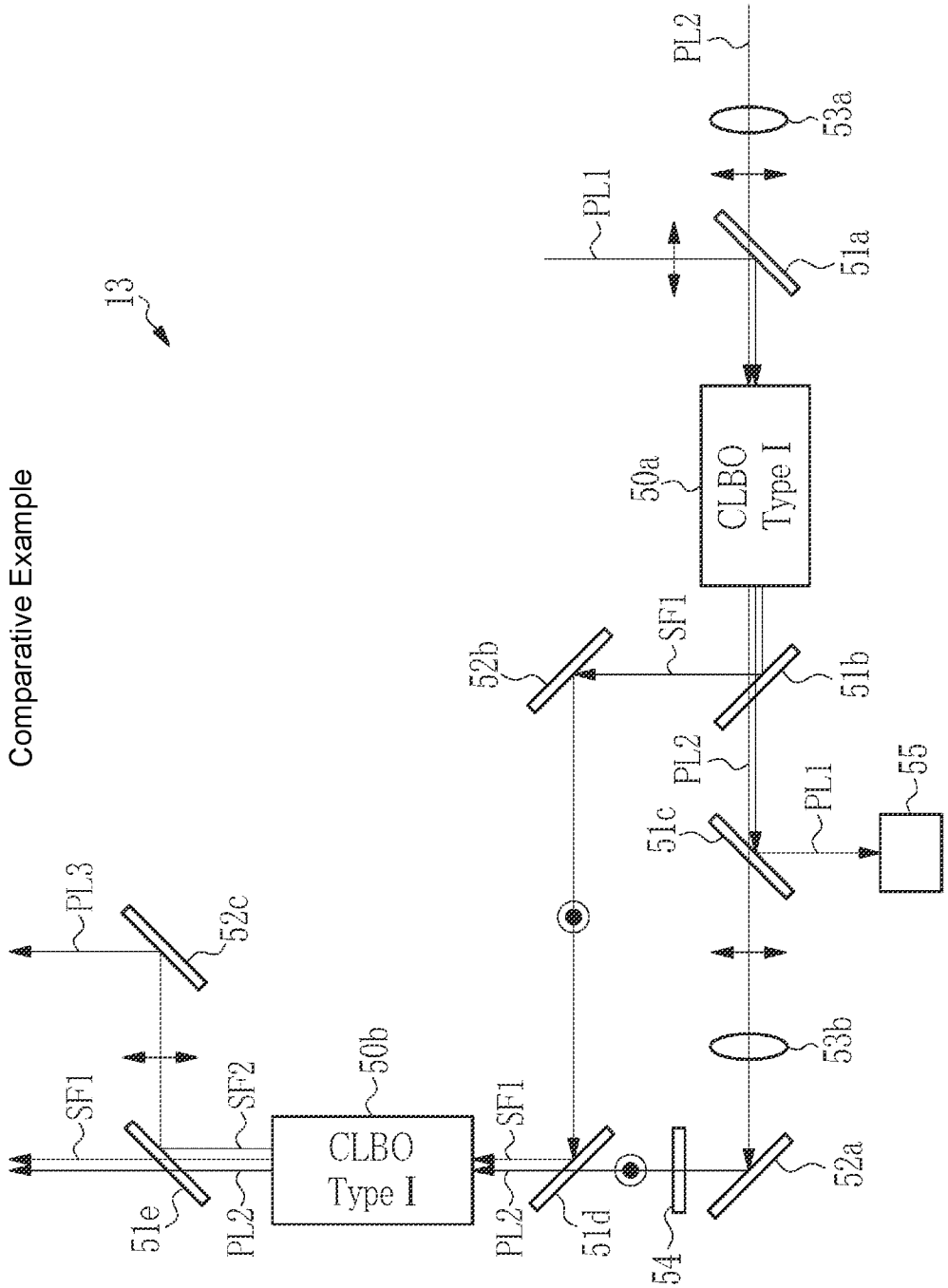
FIG. 3 schematically shows the configuration of a wavelength conversion system shown in FIG. 1.

FIG. 3 schematically shows the configuration of the wavelength conversion system 13 shown in FIG. 1. The wavelength conversion system 13 includes first and second CLBO crystals 50a, 50b, first to fifth dichroic mirrors 51a to 51d, first to third high reflectance mirrors 52a to 52c, a half wave plate 54, a light collection lens 53a, and a collimator lens 53b.

The first dichroic mirror 51a has a film coated thereon, and the film is configured to reflect the first pulsed laser light PL1 at high reflectance and transmit the second pulsed laser light PL2 at high transmittance. The first pulsed laser light PL1 is incident on one surface of the first dichroic mirror 51a. The second pulsed laser light PL2 is incident on the other surface of the first dichroic mirror 51a via the light collection lens 53a. The first dichroic mirror 51a is so disposed that the first pulsed laser light PL1 and the second pulsed laser light PL2 are incident on the first CLBO crystal 50a in such a way that the optical path axes of the first pulsed laser light PL1 and the second pulsed laser light PL2 coincide with each other.

The first CLBO crystal 50a is a nonlinear optical crystal having a type-1 phase matching condition. The first CLBO crystal 50a is configured to produce first sum frequency light SF1 having a wavelength of about 220.9 nm, which is the sum frequency resulting from the first pulsed laser light PL1 and the second pulsed laser light PL2.

The second dichroic mirror 51b is disposed in the optical path of the first pulsed laser light PL1, the second pulsed laser light PL2, and the first sum frequency light SF1 outputted from the first CLBO crystal 50a. The second dichroic mirror 51b has a film coated thereon, and the film is configured to transmit the first pulsed laser light PL1 and the second pulsed laser light PL2 at high transmittance and reflect the first sum frequency light SF1 at high reflectance. The first sum frequency light SF1 is produced by the first CLBO crystal 50a as the sum frequency light having a sum frequency resulting from the first pulsed laser light PL1 and the second pulsed laser light PL2 and has the wavelength of about 220.9 nm.

The third dichroic mirror 51c is disposed in the optical path of the first pulsed laser light PL1 and the second pulsed laser light PL2 having passed through the second dichroic mirror 51b. The third dichroic mirror 51c has a film coated thereon, and the film is configured to reflect the first pulsed laser light PL1 at high reflectance and transmit the second pulsed laser light PL2 at high transmittance.

A damper 55 is disposed in the optical path of the first pulsed laser light PL1 reflected off the third dichroic mirror 51c. The damper 55 is configured to absorb the first pulsed laser light PL1 incident thereon.

The collimator lens 53b is disposed in the optical path of the second pulsed laser light PL2 having passed through the third dichroic mirror 51c. The first high reflectance mirror 52a is disposed in the optical path of the second pulsed laser light PL2 having passed through the collimator lens 53b and is configured to reflect the second pulsed laser light PL2 at high reflectance.

The half wave plate 54 is disposed in the optical path of the second pulsed laser light PL2 reflected off the first high reflectance mirror 52a. The half wave plate 54 is configured to rotate the polarization direction of the second pulsed laser light PL2 passing therethrough by 90°.

The second high reflectance mirror 52b is disposed in the optical path of the first sum frequency light SF1 reflected off the second dichroic mirror 51b and is configured to reflect the first sum frequency light SF1 at high reflectance. The fourth dichroic mirror 51d is disposed at the intersection of the optical path of the second pulsed laser light PL2 having passed through the half wave plate 54 and the optical path of the first sum frequency light SF1 reflected off the second high reflectance mirror 52b. The fourth dichroic mirror 51d has a film coated thereon, and the film is configured to reflect the first sum frequency light SF1 at high reflectance and transmit the second pulsed laser light PL2 at high transmittance.

The second CLBO crystal 50b is a nonlinear optical crystal having a type-1 phase matching condition. The second CLBO crystal 50b is disposed in the optical path of the second pulsed laser light PL2 having passed through the fourth dichroic mirror 51d and the first sum frequency light SF1 reflected off the fourth dichroic mirror 51d. The second CLBO crystal 50b is configured to produce second sum frequency light SF2 having the wavelength of about 193.4 nm, which is the sum frequency resulting from the second pulsed laser light PL2 and the first sum frequency light SF1.

The fifth dichroic mirror 51e is disposed in the optical path of the second pulsed laser light PL2, the first sum frequency light SF1, and the second sum frequency light SF2. The fifth dichroic mirror 51e has a film coated thereon, and the film is configured to transmit the second pulsed laser light PL2 and the first sum frequency light SF1 at high transmittance and reflect the second sum frequency light SF2 at high reflectance. The second sum frequency light SF2 has the sum frequency resulting from the second pulsed laser light PL2 and the first sum frequency light SF1 and has the wavelength of about 193.4 nm.

The third high reflectance mirror 52c is disposed in the optical path of the second sum frequency light SF2 reflected off the fifth dichroic mirror 51e and is configured to reflect the second sum frequency light SF2 at high reflectance. The second sum frequency light SF2 is outputted as the third pulsed laser light PL3 from the wavelength conversion system 13.

1.3.2 Configuration of CLBO Crystals

Figure 4:
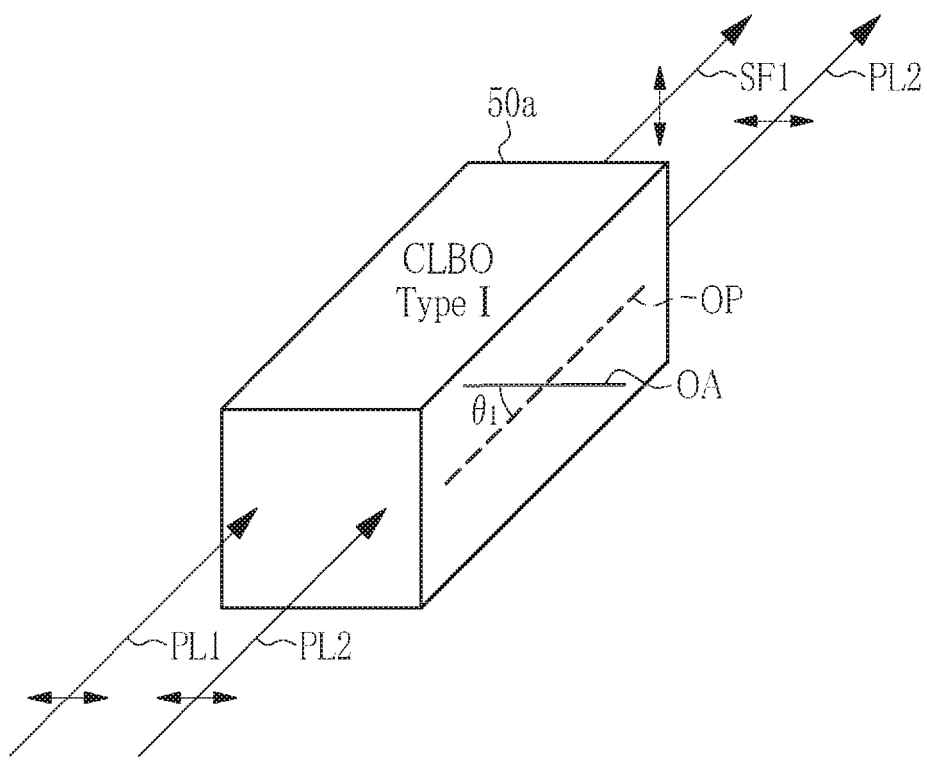
FIG. 4 shows the configuration of a first CLBO crystal having a type-1 phase matching condition.

FIG. 4 shows the configuration of the first CLBO crystal 50a. The first CLBO crystal 50a is so configured that an angle θ1 between an optical axis OA of the first CLBO crystal 50a and an optical path axis OP of the pulsed laser light incident on the first CLBO crystal 50a is a phase matching angle that satisfies a type-1 phase matching condition. To calculate the phase matching angle, Dr. Arlee Smith at AS-Photonics, LLC has developed free software, SNLO. SNLO can be used to calculate the phase matching angle. SNLO is available at AS-Photonics. The same holds true for the configuration of the second CLBO crystal 50b.

It is assumed in the present disclosure that linearly polarized light having a polarization direction perpendicular to a plane defined by the optical axis OA of the nonlinear optical crystal and the optical path axis OP of light incident on the nonlinear optical crystal has a first polarization state, and that linearly polarized light having a polarization direction parallel to the plane has a second polarization state.

1.3.3 Effects

Effects of the wavelength conversion system 13 will next be described. The first pulsed laser light PL1 and the second pulsed laser light PL2 enter the wavelength conversion system 13. The first pulsed laser light PL1 and the second pulsed laser light PL2 are both linearly polarized light and incident as p-polarized light on the first dichroic mirror 51a in Comparative Example. The first pulsed laser light PL1 reflected off the first dichroic mirror 51a and the second pulsed laser light PL2 having passed through the first dichroic mirror 51a are incident on the first CLBO crystal 50a substantially at the same time and undergo sum frequency mixing.

The first pulsed laser light PL1 and the second pulsed laser light PL2 incident on the first CLBO crystal 50a both have the first polarization state and have polarization directions parallel to each other. The first CLBO crystal 50a is configured to produce the first sum frequency light SF1 having the wavelength of about 220.9 nm, which is the sum frequency resulting from the wavelength of about 257.5 nm and the wavelength of about 1554 nm. The first sum frequency light SF1 has the second polarization state.

The second dichroic mirror 51b is configured to separate the first sum frequency light SF1 from the first pulsed laser light PL1 and the second pulsed laser light PL2. The third dichroic mirror 51c is configured to separate the second pulsed laser light PL2 from the first pulsed laser light PL1. The first pulsed laser light PL1 is absorbed by the damper 55.

The second pulsed laser light PL2 separated by the third dichroic mirror 51c enters the second collimator lens 53. The collimator lens 53b is configured to cause the diverging second pulsed laser light PL2 to converge in such a way that the beam diameter of the second pulsed laser light PL2 is not truncated by the light incident end surface of the second CLBO crystal 50b. In a case where the second pulsed laser light PL2 has a small angle of divergence, the collimator lens 53b may be omitted.

The second pulsed laser light PL2 having passed through the collimator lens 53b is reflected off the first high reflectance mirror 52a at high reflectance and enters the half wave plate 54. The half wave plate 54 is configured to rotate the polarization direction of the second pulsed laser light PL2 by 90°, so that the polarization state of the second pulsed laser light PL2 is changed from the first polarization state to the second polarization state.

The fourth dichroic mirror 51d is configured to cause the optical path of the first sum frequency light SF1 to substantially coincide with the optical path of the second pulsed laser light PL2, and the first sum frequency light SF1 and the second pulsed laser light PL2 are incident on the second CLBO crystal 50b substantially at the same time. The first sum frequency light SF1 and the second pulsed laser light PL2 incident on the second CLBO crystal 50b both have the second polarization state and have polarization directions parallel to each other.

The second CLBO crystal 50b is configured to produce the second sum frequency light SF2 having the wavelength of about 193.4 nm, which is the sum frequency resulting from the wavelength of about 220.9 nm and the wavelength of about 1554 nm. The second pulsed laser light PL2 and the first sum frequency light SF1 pass through the fifth dichroic mirror 51e at high transmittance, and the second sum frequency light SF2 is reflected off the fifth dichroic mirror 51e at high reflectance. The second sum frequency light SF2 reflected off the fifth dichroic mirror 51e at high reflectance is reflected off the third high reflectance mirror 52c at high reflectance and outputted as the third pulsed laser light PL3 described above from the wavelength conversion system 13.

1.4 Problems

Problems with the wavelength conversion system 13 provided in the laser apparatus 2 for exposure apparatus according to Comparative Example will next be described. Since the first sum frequency light SF1 and the second pulsed laser light PL2 outputted from the first CLBO crystal 50a have different polarization states, the wavelength conversion system 13 needs to cause the optical paths of the first sum frequency light SF1 and the second pulsed laser light PL2 to branch off and then merge each other in order to cause the first sum frequency light SF1 and the second pulsed laser light PL2 having the same polarization state to be incident on the second CLBO crystal 50b. The half wave plate 54 needs to be disposed in one of the two branch optical paths. To this end, the wavelength conversion system 13 needs to include optical elements, such as a dichroic mirror and a high reflectance mirror, to cause the optical paths to branch off and then merge with each other and therefore has a large size and occupies a large footprint. Since the optical elements each have a low threshold of damage due to ultraviolet light, it is difficult to increase the intensity of the pulsed laser light.

2. First Embodiment

A laser apparatus for exposure apparatus according to a first embodiment of the present disclosure will next be described. The laser apparatus for exposure apparatus according to the first embodiment has the same configuration as that of the laser apparatus 2 for exposure apparatus according to Comparative Example shown in FIGS. 1 and 2 except that the wavelength conversion system is configured differently. In the following description, substantially the same portions as the components of the laser apparatus 2 for exposure apparatus according to Comparative Example shown in FIG. 1 have the same reference characters and will not be described as appropriate.

2.1 Overview Configuration

Figure 5:
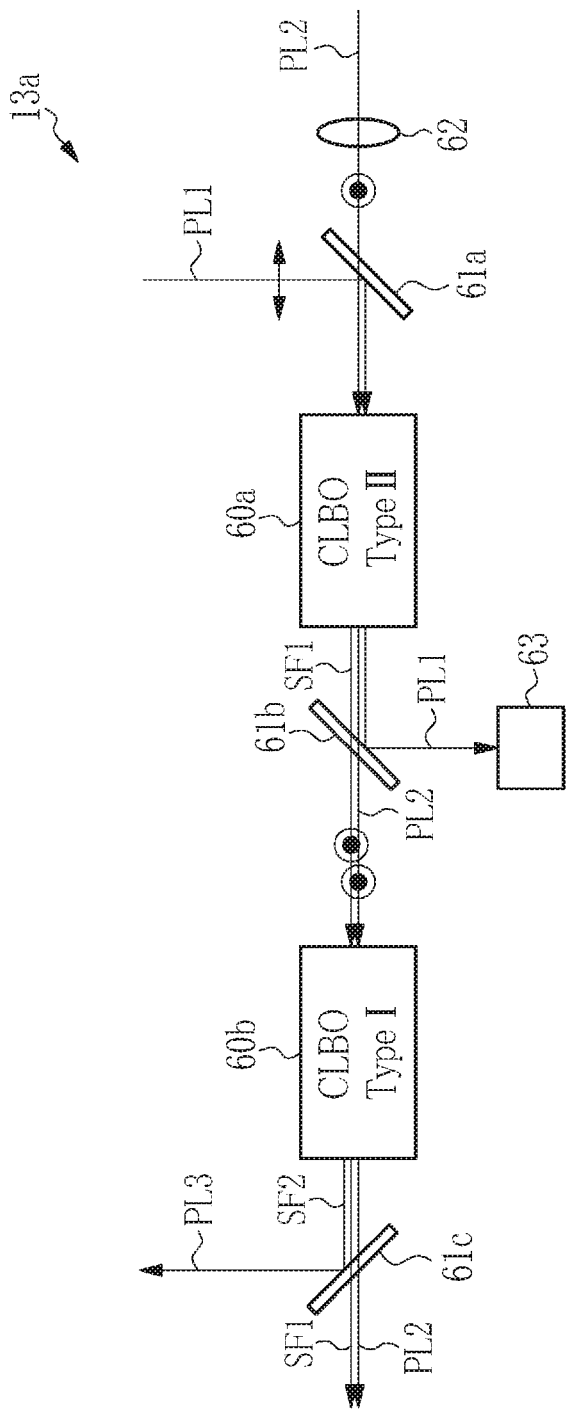
FIG. 5 schematically shows the configuration of a wavelength conversion system according to a first embodiment.

FIG. 5 schematically shows the configuration of a wavelength conversion system 13a according to the first embodiment. The wavelength conversion system 13a includes first and second CLBO crystals 60a, 60b, first to third dichroic mirrors 61a to 61c, a light collection lens 62, and a damper 63.

The first dichroic mirror 61a has the same configuration as that of the first dichroic mirror 51a in the Comparative Example and has a film coated thereon, and the film is configured to reflect the first pulsed laser light PL1 at high reflectance and transmit the second pulsed laser light PL2 at high transmittance. The first pulsed laser light PL1 is incident on one surface of the first dichroic mirror 61a. The second pulsed laser light PL2 is incident on the other surface of the first dichroic mirror 61a via the light collection lens 62. The first dichroic mirror 61a is so disposed that the first pulsed laser light PL1 and the second pulsed laser light PL2 are incident on the first CLBO crystal 60a in such a way that the optical path axes of the first pulsed laser light PL1 and the second pulsed laser light PL2 coincide with each other.

The wavelength of the first pulsed laser light PL1 is about 257.5 nm and corresponds to the first wavelength set forth in the claims. The wavelength of the second pulsed laser light PL2 is about 1554 nm and corresponds to the second wavelength set forth in the claims.

The first CLBO crystal 60a is a nonlinear optical crystal having the type-2 phase matching condition. The first CLBO crystal 60a is configured to produce the first sum frequency light SF1 having the wavelength of about 220.9 nm, which is the sum frequency resulting from the first pulsed laser light PL1 and the second pulsed laser light PL2. The wavelength of the first sum frequency light SF1 corresponds to the third wavelength set forth in the claims.

The second dichroic mirror 61b is disposed in the optical path of the first pulsed laser light PL1, the second pulsed laser light PL2, and the first sum frequency light SF1 outputted from the first CLBO crystal 60a. The second dichroic mirror 61b has a film coated thereon, and the film is configured to reflect the first pulsed laser light PL1 at high reflectance and transmit the second pulsed laser light PL2 and the first sum frequency light SF1 at high transmittance.

The damper 63 is disposed in the optical path of the first pulsed laser light PL1 reflected off the second dichroic mirror 61b. The damper 63 is configured to absorb the first pulsed laser light PL1 incident thereon.

The second CLBO crystal 60b is a nonlinear optical crystal having a type-1 phase matching condition. The second CLBO crystal 60b is disposed in the optical path of the second pulsed laser light PL2 and the first sum frequency light SF1 having passed through the second dichroic mirror 61b. The second CLBO crystal 60b is configured to produce the second sum frequency light SF2 having the wavelength of about 193.4 nm, which is the sum frequency resulting from the second pulsed laser light PL2 and the first sum frequency light SF1. The wavelength of the second sum frequency light SF2 corresponds to the fourth wavelength set forth in the claims.

The third dichroic mirror 61c is disposed in the optical path of the second pulsed laser light PL2, the first sum frequency light SF1, and the second sum frequency light SF2. The third dichroic mirror 61c has a film coated thereon, and the film is configured to transmit the second pulsed laser light PL2 and the first sum frequency light SF1 at high transmittance and reflect the second sum frequency light SF2 at high reflectance. The second sum frequency light SF2 is outputted as the third pulsed laser light PL3 from the wavelength conversion system 13a.

The second wavelength is longer than the first wavelength. The first wavelength is longer than the third wavelength. The third wavelength is longer than the fourth wavelength.

2.2 Configuration of CLBO Crystals

Figure 6:
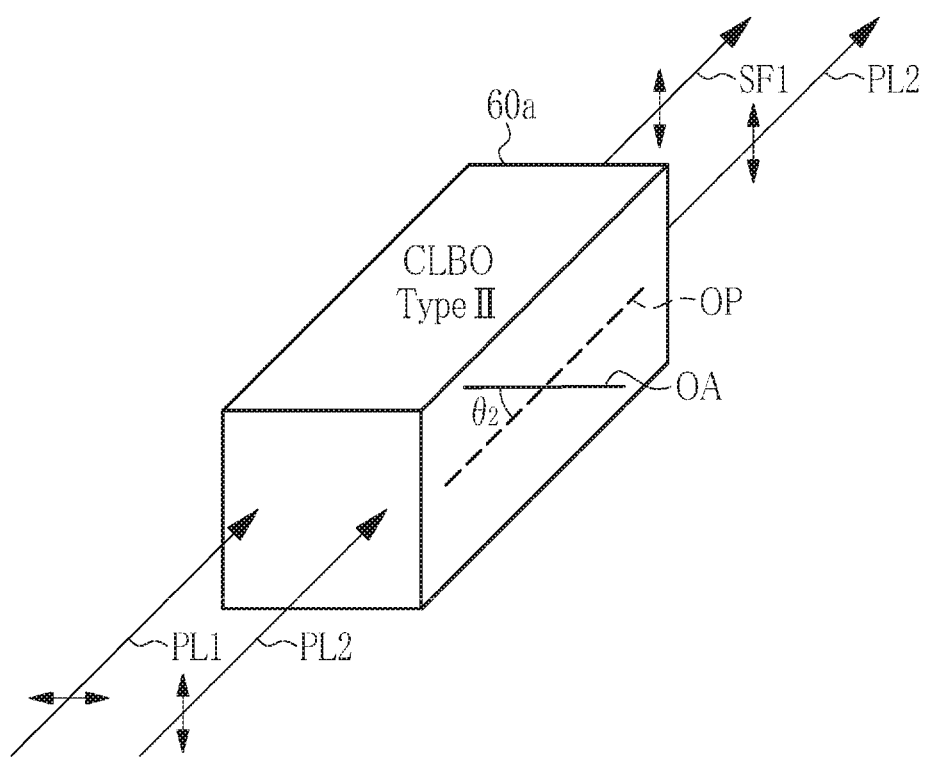
FIG. 6 shows the configuration of a first CLBO crystal having a type-2 phase matching condition.

FIG. 6 shows the configuration of the first CLBO crystal 60a. The first CLBO crystal 60a is so configured that an angle θ2 between the optical axis OA of the first CLBO crystal 60a and the optical path axis OP of the pulsed laser light incident on the first CLBO crystal 60a is a phase matching angle that satisfies the type-2 phase matching condition. SNLO described above can be used to calculate the phase matching angle. The second CLBO crystal 60b has the same configuration as that of the second CLBO crystal 50b in Comparative Example.

According to FIG. 6, the first pulsed laser light PL1 having the first wavelength has the first polarization state, the second pulsed laser light PL2 having the second wavelength has the second polarization state, and the first sum frequency light SF1 having the third wavelength has the second polarization state. According to the result of the SNLO-based calculation of the phase matching angle, the type-2 CLBO crystal does not have any phase matching angle in the other polarization conditions.

2.3 Effects

Effects of the wavelength conversion system 13a will next be described. The first pulsed laser light PL1 and the second pulsed laser light PL2 enter the wavelength conversion system 13a. The first pulsed laser light PL1 and the second pulsed laser light PL2 are both linearly polarized light. In the present embodiment, the first pulsed laser light PL1 is incident as p-polarized light on the first dichroic mirror 61a, and the second pulsed laser light PL2 is incident as s-polarized light on the first dichroic mirror 61a. The first pulsed laser light PL1 reflected off the first dichroic mirror 61a and the second pulsed laser light PL2 having passed through the first dichroic mirror 61a are incident on the first CLBO crystal 60a substantially at the same time and undergo sum frequency mixing.

The first pulsed laser light PL1 incident on the first CLBO crystal 60a has the first polarization state. The second pulsed laser light PL2 incident on the first CLBO crystal 60a has the second polarization state. That is, the first pulsed laser light PL1 and the second pulsed laser light PL2 have polarization directions perpendicular to each other.

The first CLBO crystal 60a is configured to produce the first sum frequency light SF1 having the wavelength of about 220.9 nm, which is the sum frequency resulting from the wavelength of about 257.5 nm and the wavelength of about 1554 nm. Since the first CLBO crystal 60a has the type-2 phase matching condition, the first sum frequency light SF1 and the second pulsed laser light PL2 outputted from the first CLBO crystal 60a have polarization directions parallel to each other.

The second dichroic mirror 61b is configured to separate the first sum frequency light SF1 and the second pulsed laser light PL2 from the first pulsed laser light PL1. The first pulsed laser light PL1 is absorbed by the damper 63.

The first sum frequency light SF1 and the second pulsed laser light PL2 separated by the second dichroic mirror 61b are incident on the second CLBO crystal 60b substantially at the same time. The first sum frequency light SF1 and the second pulsed laser light PL2 incident on the second CLBO crystal 60b both have the second polarization state and have polarization directions parallel to each other.

The second CLBO crystal 60b is configured to produce the second sum frequency light SF2 having the wavelength of about 193.4 nm, which is the sum frequency resulting from the wavelength of about 220.9 nm and the wavelength of about 1554 nm. The second pulsed laser light PL2 and the first sum frequency light SF1 pass through the third dichroic mirror 61c at high transmittance, and the second sum frequency light SF2 is reflected off the third dichroic mirror 61c at high reflectance. The second sum frequency light SF2 reflected off the third dichroic mirror 61c at high reflectance is reflected off the third high reflectance mirror 52c and outputted as the third pulsed laser light PL3 described above from the wavelength conversion system 13a.

2.4 Advantages

Advantages of the wavelength conversion system 13a provided in the laser apparatus for exposure apparatus according to the present embodiment will next be described. In the present embodiment, the first CLBO crystal 60a has the type-2 phase matching condition. Since the first pulsed laser light PL1 and the second pulsed laser light PL2 having polarization directions perpendicular to each other are incident on the first CLBO crystal 60a, the first sum frequency light SF1 and the second pulsed laser light PL2 outputted from the first CLBO crystal 60a have polarization directions parallel to each other. Therefore, in the present embodiment, the first sum frequency light SF1 and the second pulsed laser light PL2 are allowed to be incident on the second CLBO crystal 60b having the type-1 phase matching condition without using optical elements, such as a dichroic mirror and a high reflectance mirror, to cause the optical paths to branch off and then merge with each other, such as those shown in Comparative Example.

As a result, the optical path between the first CLBO crystal 60a and the second CLBO crystal 60b can be shortened, resulting in a compact wavelength conversion system 13a, as compared with Comparative Example. Further, since the number of optical elements is reduced, the possibility of damage on the optical elements is lowered.

Further, the second pulsed laser light PL2 is infrared light having the long wavelength of about 1554 nm and therefore tends to diverge. In the present embodiment, however, the optical path between the first CLBO crystal 60a and the second CLBO crystal 60b can be shortened to the extent that the second pulsed laser light PL2 can be considered as parallel light, whereby the collimator lens used in Comparative Example can be omitted.

In the present embodiment, in which the second dichroic mirror 61b is disposed between the first CLBO crystal 60a and the second CLBO crystal 60b, the first pulsed laser light PL1 is so guided to the damper 63 as not to be incident on the second CLBO crystal 60b. However, since the wavelength of the first pulsed laser light PL1 is not converted even when the first pulsed laser light PL1 is incident on the second CLBO crystal 60b, the second dichroic mirror 61b and the damper 63 can be omitted. Thus, the optical path between the first CLBO crystal 60a and the second CLBO crystal 60b can be further shortened.

In the present embodiment, the upstream first CLBO crystal 60a is a nonlinear optical crystal having the type-2 phase matching condition, and the downstream second CLBO crystal 60b is a nonlinear optical crystal having the type-1 phase matching condition. In principle, the upstream first CLBO crystal 60a can be a nonlinear optical crystal having the type-1 phase matching condition, and the downstream second CLBO crystal 60b can be a nonlinear optical crystal having the type-2 phase matching condition, in contrast to the above. However, the configuration in which the upstream first CLBO crystal 60a is a type-2 CLBO crystal, as in the first embodiment, is more favorable in terms of the following points than the configuration in which the downstream second CLBO crystal 60b is a type-2 CLBO crystal.

Figure 7:
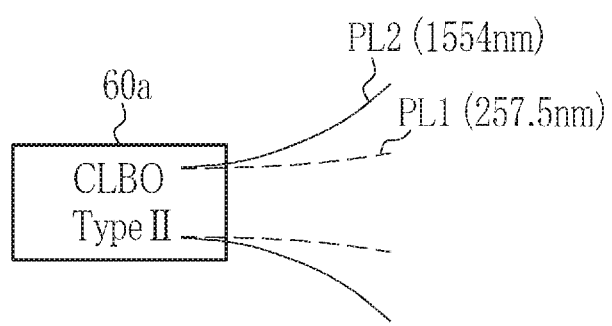
FIG. 7 describes the range of an acceptable angle of incidence for a type-2 crystal.

Table 1 shows the difference in nonlinear optical constant and acceptable angle of incidence between a type-1 crystal and a type-2 crystal. The nonlinear constants of the type-1 and type-2 crystals are substantially equal to each other. A type-2 crystal, however, has a significantly larger range of the acceptable angle of incidence (mrad·cm) of about 11.08 with respect to the second pulsed laser light PL2, which is infrared light having the long wavelength of about 1554 nm, than the range of the acceptable angle of incidence of about 2.56 for a type-1 crystal, as shown in FIG. 7.

TABLE 1

| | | | Type-1 | Type-2 |
|---|---|---|---|---|
| $\lambda_{SFG}$ | $\lambda_{in}$ | Nonlinear constant (pm/V) | 0.799 | 0.8 |
| 220.9 nm | 1554 nm | Range of acceptable angle of incidence (mrad · cm) | 2.56 | 11.08 |
| | 257.5 nm | | 0.4 | 0.43 |

Therefore, if the second pulsed laser light PL2, which is infrared light, is first incident on a type-1 crystal, a large number of components are not incident on the light-incident-side end of the crystal at acceptable angles of incidence. In this case, the second pulsed laser light PL2 is greatly lost in the crystal through which the second pulsed laser light PL2 first passes, resulting in a decrease in intensity of the first sum frequency light SF1 to be produced. In contrast, when the second pulsed laser light PL2, which is infrared light, is first incident on a type-2 crystal, as in the present embodiment, the amount of loss at the light-incident-side end of the crystal is small, whereby high-intensity first sum frequency light SF1 is produced. When the first sum frequency light SF1 has high intensity, the second sum frequency light SF2, which is produced in the following crystal, has high intensity as well. As described above, the configuration in which the upstream first CLBO crystal 60a is a type-2 crystal allows improvement in conversion efficiency, whereby the first sum frequency light SF1 and the second sum frequency light SF2 both have high intensity.

3. Second Embodiment

A laser apparatus for exposure apparatus according to a second embodiment of the present disclosure will next be described. The laser apparatus for exposure apparatus according to the second embodiment has the same configuration as that of the laser apparatus for exposure apparatus according to the first embodiment except that the wavelength conversion system is configured differently. In the following description, substantially the same portions as the components of the wavelength conversion system 13a shown in FIG. 4 have the same reference characters and will not be described as appropriate.

3.1 Configuration

Figure 8:
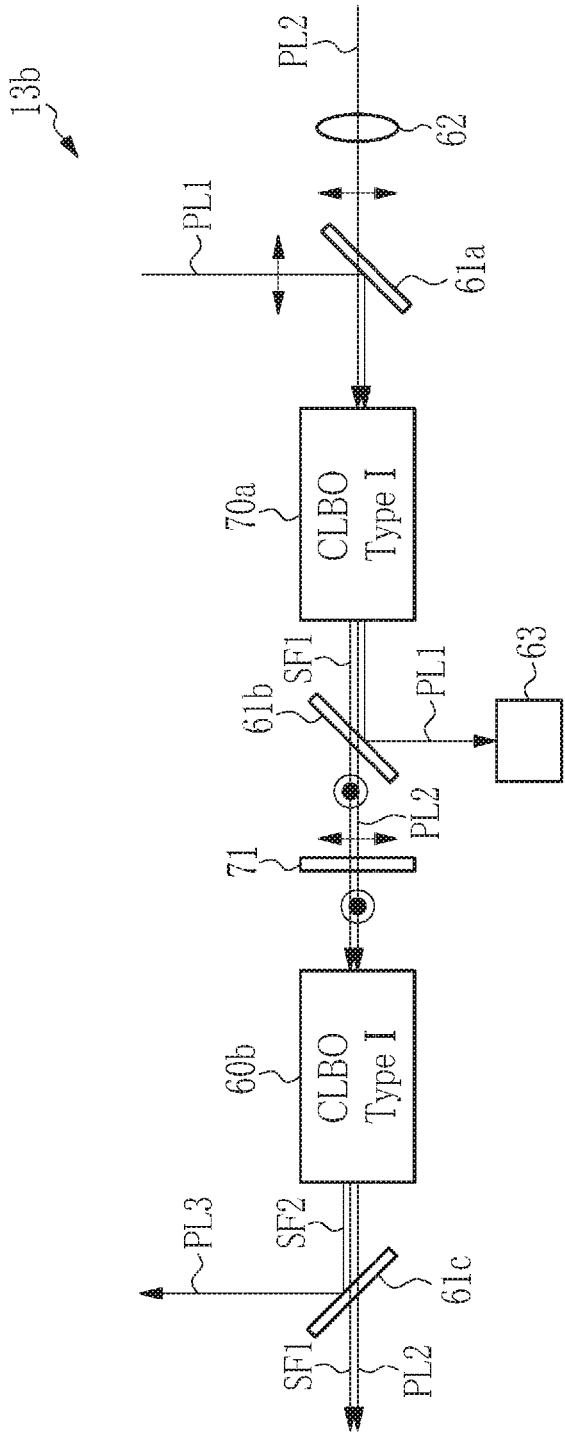
FIG. 8 schematically shows the configuration of a wavelength conversion system according to a second embodiment.

FIG. 8 schematically shows the configuration of a wavelength conversion system 13b according to the second embodiment. The wavelength conversion system 13b uses a first CLBO crystal 70a, which is a nonlinear optical crystal having the type-1 phase matching condition, in place of the first CLBO crystal 60a, which is a nonlinear optical crystal having the type-2 phase matching condition. Further, in the present embodiment, a two-wavelength wave plate 71 is disposed between the first CLBO crystal 70a and the second CLBO crystal 60b.

The two-wavelength wave plate 71 is a wave plate providing a specific phase difference between two wavelengths. Specifically, the two-wavelength wave plate 71 does not change the polarization direction of the first pulsed laser light PL1 having the wavelength of about 257.5 nm but is configured to rotate the polarization direction of the second pulsed laser light PL2 having the wavelength of about 1554 nm by 90°.

Further, in the present embodiment, in which the first CLBO crystal 70a having the type-1 phase matching conditions is used, the first pulsed laser light PL1 and the second pulsed laser light PL2 to be incident on the first CLBO crystal 70a are caused to each have the first polarization state.

3.2 Effects

Effects of the wavelength conversion system 13b will next be described. The first pulsed laser light PL1 and the second pulsed laser light PL2 enter the wavelength conversion system 13b. The first pulsed laser light PL1 and the second pulsed laser light PL2 are both linearly polarized light and incident as p-polarized light on the first dichroic mirror 61a in the present embodiment. The first pulsed laser light PL1 reflected off the first dichroic mirror 61a and the second pulsed laser light PL2 having passed through the first dichroic mirror 61a are incident on the first CLBO crystal 70a substantially at the same time and undergo sum frequency mixing.

The first pulsed laser light PL1 and the second pulsed laser light PL2 incident on the first CLBO crystal 70a both have the first polarization state. The first CLBO crystal 70a is configured to produce the first sum frequency light SF1 having the wavelength of about 220.9 nm, which is the sum frequency resulting from the wavelength of about 257.5 nm and the wavelength of about 1554 nm. Since the first CLBO crystal 70a has the type-1 phase matching condition, the first sum frequency light SF1 and the second pulsed laser light PL2 outputted from the first CLBO crystal 70a have polarization directions perpendicular to each other. Specifically, the first sum frequency light SF1 outputted from the first CLBO crystal 70a has the second polarization state, and the second pulsed laser light PL2 outputted from the first CLBO crystal 70a has the first polarization state.

The second dichroic mirror 61b and the damper 63 provide the same effects as those provided in the first embodiment and are configured to separate the first sum frequency light SF1 and the second pulsed laser light PL2 from the first pulsed laser light PL1. The first sum frequency light SF1 and the second pulsed laser light PL2 separated by the second dichroic mirror 61b enter the two-wavelength wave plate 71. The two-wavelength wave plate 71 is configured not to change the polarization direction of the first sum frequency light SF1 passing therethrough so that the first sum frequency light SF1 still has the second polarization state but rotate the polarization direction of the second pulsed laser light PL2 by 900 so that the second pulsed laser light PL2 has the second polarization state.

The first sum frequency light SF1 and the second pulsed laser light PL2 having passed through the two-wavelength wave plate 71 are incident on the second CLBO crystal 60b substantially at the same time. The first sum frequency light SF1 and the second pulsed laser light PL2 incident on the second CLBO crystal 60b both have the second polarization state.

The second CLBO crystal 60b and the third dichroic mirror 61c provide the same effects as those provided in the first embodiment. The second CLBO crystal 60b is configured to produce the second sum frequency light SF2 having the wavelength of about 193.4 nm. The second sum frequency light SF2 reflected off the third dichroic mirror 61c at high reflectance is reflected off the third high reflectance mirror 52c and outputted as the third pulsed laser light PL3 described above from the wavelength conversion system 13b.

3.3 Advantages

Advantages of the wavelength conversion system 13b provided in the laser apparatus for exposure apparatus according to the present embodiment will next be described. In the present embodiment, in which the two-wavelength wave plate 71 is disposed between the first CLBO crystal 70a and the second CLBO crystal 60b, the first CLBO crystal 70a and the second CLBO crystal 60b can both be nonlinear optical crystals having the type-1 phase matching condition. A type-1 crystal is more easily available than a type-2 crystal. The present embodiment therefore allows the wavelength conversion system 13b to be manufactured at low cost in addition to the advantages provided by the first embodiment.

The first CLBO crystal 70a and the second CLBO crystal 60b can both be type-2 crystals if the manufacturing cost is not an issue. In this case, however, the nonlinear constant (pm/V) of the second CLBO crystal 60b is undesirably about 0.692, which is smaller than about 0.998, which is the nonlinear constant in the case where the first CLBO crystal 70a and the second CLBO crystal 60b are both type-1 crystals, as shown in Table 2. The configuration in which the first CLBO crystal 70a and the second CLBO crystal 60b are both type-2 crystals is therefore not very favorable as compared with the present embodiment.

TABLE 2

| $\lambda_{SFG}$ | $\lambda_{in}$ | | Type-1 | Type-2 |
|---|---|---|---|---|
| | | Nonlinear constant (pm/V) | 0.998 | 0.692 |
| 193.4 nm | 1554 nm<br>220.9 nm | Range of acceptable angle of incidence (mrad · cm) | 2.77<br>0.37 | 10.69<br>0.43 |

4. Beam Diameter

The beam diameter of the pulsed laser light incident on each of the first CLBO crystal 60a and the second CLBO crystal 60b in the first embodiment will next be described.

Figure 9A:
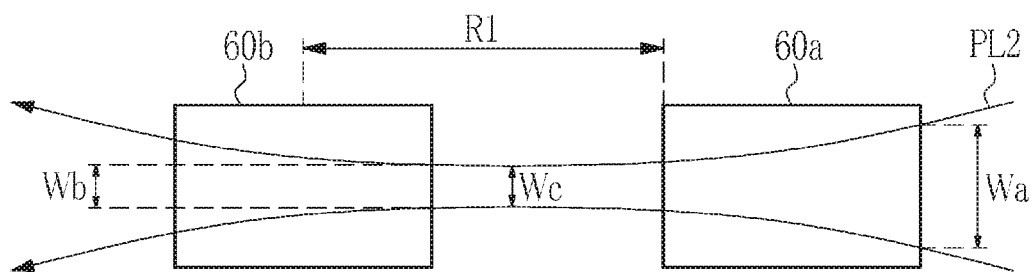
FIG. 9A shows the beam diameter of second pulsed laser light incident on first and second CLBO crystals in the first embodiment.

In FIG. 9A, Wa represents the beam diameter of the second pulsed laser light PL2 to be incident on the light-incident-side end surface of the first CLBO crystal 60a. Wb represents the beam diameter of the second pulsed laser light PL2 to be incident on the light-incident-side end surface of the second CLBO crystal 60b. The second pulsed laser light PL2 is infrared light and has a clear beam waist. We represents the beam diameter of the second pulsed laser light PL2 at the beam waist position.

Figure 9B:
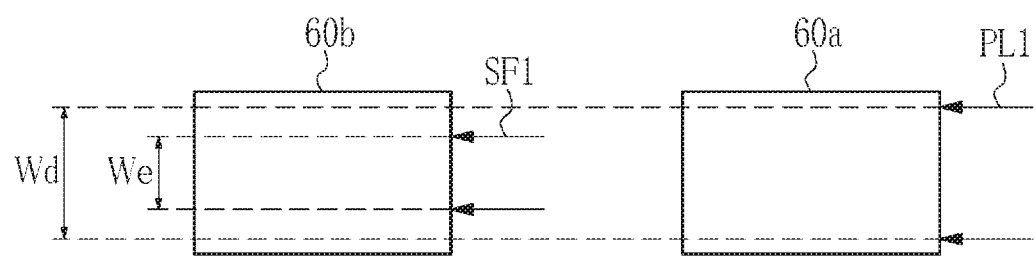
FIG. 9B shows the beam diameters of first sum frequency light and first pulsed laser light incident on the first and second CLBO crystals in the first embodiment.

In FIG. 9B, Wd represents the beam diameter of the first pulsed laser light PL1 to be incident on the light-incident-side end surface of the first CLBO crystal 60a. We represents the beam diameter of the first sum frequency light SF1 to be incident on the light-incident-side end surface of the second CLBO crystal 60b.

The beam diameters preferably satisfy the following relationships: Wa>Wb and Wd>We. Further, the beam diameters preferably satisfy the following relationships: Wa<Wd and Wb<We. The beam waist position of the second pulsed laser light PL2 preferably falls within a range R1 from the position of the light-exiting-side end surface of the first CLBO crystal 60a to the center position of the second CLBO crystal 60b.

Table 3 shows ideal values of the intensity of the pulsed laser light at the end surfaces of the first CLBO crystal 60a and the second CLBO crystal 60b. The intensity values preferably fall within a range from +20% of the ideal values to −20% thereof.

TABLE 3

|  |  | PL1 | PL2 | SF1 | SF2(PL3) |
|---|---|---|---|---|---|
| First CLBO crystal | Light-incident-side end surface | 1.8 | 12.4 | — | — |
|  | Light-exiting-side end surface | — | — | 4.9 | — |
| Second CLBO crystal | Light-incident-side end surface | 2.5 | — | 4.9 | — |
|  | Light-exiting-side end surface | — | — | — | 3.2 |

Unit: $MW/cm^2$

Figure 10A:
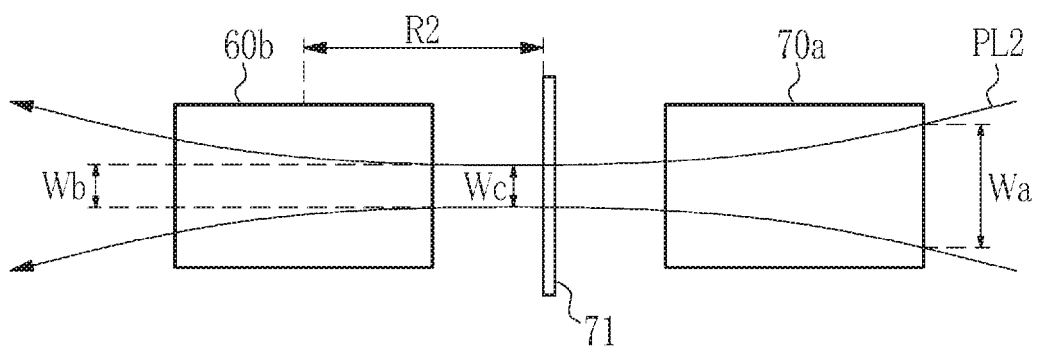
FIG. 10A shows the beam diameter of the second pulsed laser light incident on the first and second CLBO crystals in the second embodiment.
Figure 10B:
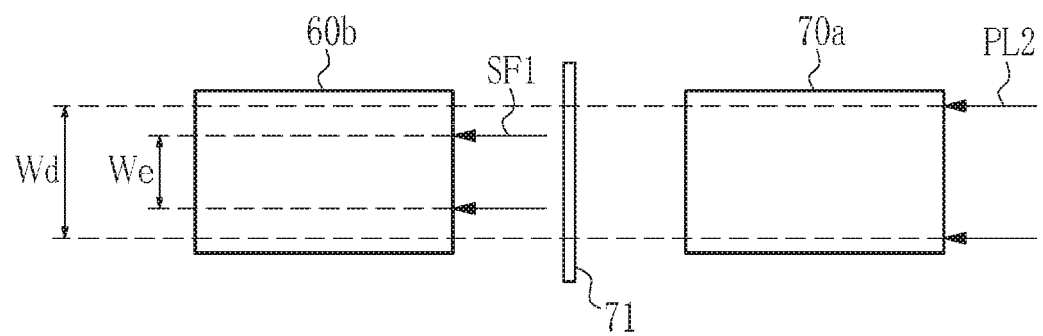
FIG. 10B shows the beam diameters of the first sum frequency light and the first pulsed laser light incident on the first and second CLBO crystals in the second embodiment.

The beam diameter of the pulsed laser light incident on each of the first CLBO crystal 70a and the second CLBO crystal 60b in the second embodiment will next be described. Wa to We in FIGS. 10A and 10B are defined in the same manner as in the first embodiment described above. The beam diameters preferably satisfy the following relationships: Wa>Wb and Wd>We also in the second embodiment. Further, the beam diameters preferably satisfy the following relationships: Wa<Wd and Wb<We. Moreover, in the second embodiment, the beam waist position of the second pulsed laser light PL2 preferably falls within a range R2 from the position of the two-wavelength wave plate 71 to the center position of the second CLBO crystal 60b.

Also in the second embodiment, as in the above description, ideal values of the intensity of the pulsed laser light at the end surfaces of the first CLBO crystal 70a and the second CLBO crystal 60b preferably fall within the range from +20% of the ideal values shown in FIG. 3 to −20% thereof.

5. Wavelength Adjustable Range

Table 4 shows a wavelength adjustable range in the first and second embodiments. When the wavelength of the first pulsed laser light PL1 is fixed at about 257.5 nm, and the wavelength of the second pulsed laser light PL2 is allowed to vary over a range from a wavelength longer than or equal to 1549 nm to a wavelength shorter than or equal to 1557 nm, the wavelength of the first sum frequency light SF1 varies over a range from a wavelength longer than or equal to 220.80 nm to a wavelength shorter than or equal to 220.96 nm. In this case, the wavelength of the second sum frequency light SF2 varies over a range from a wavelength longer than or equal to 193.25 nm to a wavelength shorter than or equal to 193.50 nm.

TABLE 4

|  | Wavelength adjustable range (nm) |
|---|---|
| PL1 | 257.5 (fixed) |
| PL2 | 1549 to 1557 |
| SF1 | 220.80 to 220.96 |
| SF2(PL3) | 193.25 to 193.50 |

6. Exposure Apparatus

Figure 11:
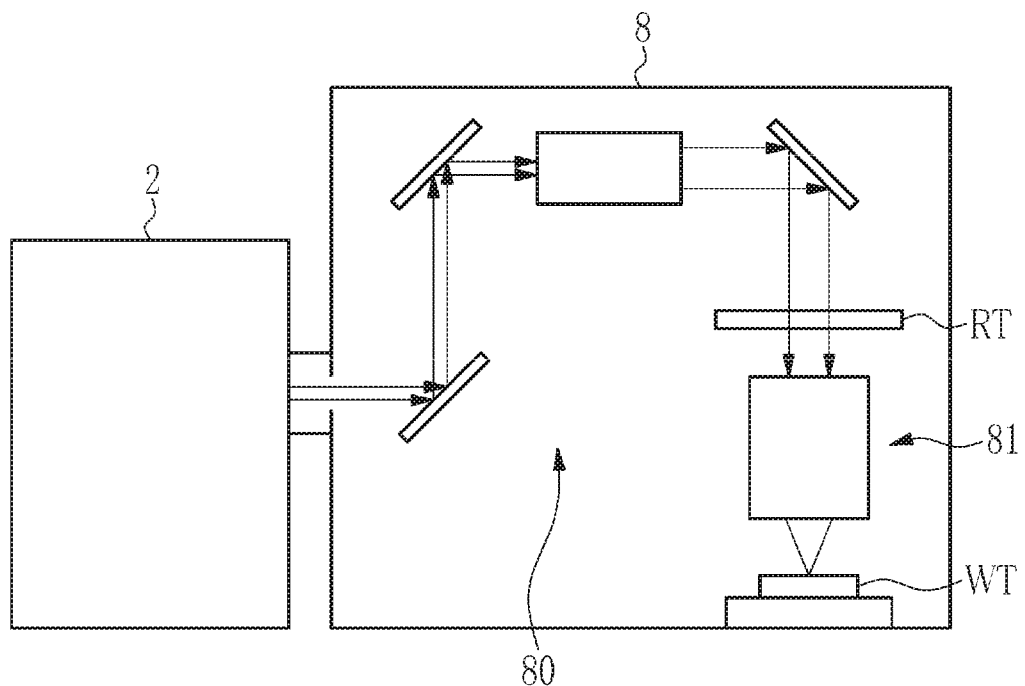
FIG. 11 shows the configuration of an exposure apparatus.

The configuration of the exposure apparatus 8 will next be described. In FIG. 11, the exposure apparatus 8 includes an illumination optical system 80 and a projection optical system 81. The illumination optical system 80 is configured to illuminate a reticle pattern on a reticle stage RT with the laser light incident from the laser apparatus 2 for exposure apparatus. The projection optical system 81 is configured to perform reduction projection on the laser light having passed through the reticle to cause the laser light to be focused on a workpiece that is not shown but is placed on a workpiece table WT. The workpiece is a light sensitive substrate on which a photoresist has been applied, such as a semiconductor wafer.

The exposure apparatus 8 is configured to translate the reticle stage RT and the workpiece table WT in synchronization with each other to expose the workpiece to the laser light having reflected the reticle pattern. A semiconductor device is manufactured by using the exposure step described above. A semiconductor device can be manufactured by transferring a device pattern onto the semiconductor wafer in the exposure step described above and processing the semiconductor wafer.

The wavelength conversion system provided in the laser apparatus 2 for exposure apparatus may either be the wavelength conversion system 13a in the first embodiment or the wavelength conversion system 13b in the second embodiment.

In the embodiments described above, a CLBO crystal is used as the nonlinear crystal, and the CLBO crystal may be replaced with a KBBF ($KBe_2BO_3F_2$) crystal or a BBO ($\beta$-$BaB_2O_4$) crystal.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A wavelength conversion system comprising:
   A. a first nonlinear optical crystal to which first pulsed laser light having a first polarization state and a first wavelength and second pulsed laser light having a second polarization state and a second wavelength are inputted and which is configured to output in response to the input the second pulsed laser light and first sum frequency light having the second polarization state and a third wavelength produced by sum frequency mixing of the first wavelength with the second wavelength; and
   B. a second nonlinear optical crystal to which the first sum frequency light and the second pulsed laser light outputted from the first nonlinear optical crystal are inputted and which is configured to output in response to the input third pulsed laser light having a fourth wavelength, wherein
   the first nonlinear optical crystal and the second nonlinear optical crystal are configured such that a beam waist position of the second pulsed laser light falls within a range from a position of a light-exiting-side end surface of the first nonlinear optical crystal to a center position of the second nonlinear optical crystal.

2. The wavelength conversion system according to claim 1, wherein
the first and second nonlinear optical crystals are each a CLBO crystal.

3. The wavelength conversion system according to claim 1, wherein
the second wavelength is longer than the first wavelength, the first wavelength is longer than the third wavelength, and the third wavelength is longer than the fourth wavelength.

4. The wavelength conversion system according to claim 3, wherein
the first wavelength is 257.5 nm,
the second wavelength falls within a range from a wavelength longer than or equal to 1549 nm to a wavelength shorter than or equal to 1557 nm,
the third wavelength falls within a range from a wavelength longer than or equal to 220.80 nm to a wavelength shorter than or equal to 220.96 nm, and
the fourth wavelength falls within a range from a wavelength longer than or equal to 193.25 nm to a wavelength shorter than or equal to 193.50 nm.

5. The wavelength conversion system according to claim 1, wherein
the fourth wavelength is produced by sum frequency mixing of the second wavelength with the third wavelength.

6. The wavelength conversion system according to claim 1, wherein
the first and second polarization states are each a state of linearly polarized light having a polarization direction parallel or perpendicular to a plane defined by an optical axis of the corresponding nonlinear optical crystal and an optical path axis of light incident thereon, and the polarization directions in the first and second polarization states are perpendicular to each other.

7. The wavelength conversion system according to claim 1, wherein
the first nonlinear optical crystal has a type-2 phase matching condition, and
the second nonlinear optical crystal has a type-1 phase matching condition.

8. A method for processing a workpiece, the method comprising
exposing the workpiece to laser light outputted from a laser apparatus for exposure apparatus including the wavelength conversion system according to claim 1.

9. The processing method according to claim 8, wherein the workpiece is a semiconductor wafer.

10. The wavelength conversion system according to claim 1, wherein
the first nonlinear optical crystal and the second nonlinear optical crystal are configured to satisfy a following relationship: Wa>Wb in a case where
Wa represents a beam diameter of the second pulsed laser light to be incident on a light-incident-side end surface of the first nonlinear optical crystal, and
Wb represents a beam diameter of the second pulsed laser light to be incident on a light-incident-side end surface of the second nonlinear optical crystal.

11. The wavelength conversion system according to claim 10, wherein
the first nonlinear optical crystal and the second nonlinear optical crystal are configured to satisfy a following relationship: Wd>We in a case where
Wd represents a beam diameter of the first pulsed laser light to be incident on the light-incident-side end surface of the first nonlinear optical crystal, and
We represents a beam diameter of the first sum frequency light to be incident on the light-incident-side end surface of the second nonlinear optical crystal.

12. A wavelength conversion system comprising:
A. a first nonlinear optical crystal to which first pulsed laser light having a first polarization state and a first wavelength and second pulsed laser light having the first polarization state and a second wavelength are inputted and which is configured to output in response to the input the second pulsed laser light and first sum frequency light having the second polarization state and a third wavelength produced by sum frequency mixing of the first wavelength with the second wavelength;
B. a wave plate to which the first sum frequency light and the second pulsed laser light outputted from the first nonlinear optical crystal are inputted and which is configured not to change the polarization state of the first sum frequency light but change the polarization state of the second pulsed laser light to the second polarization state; and
C. a second nonlinear optical crystal to which the first sum frequency light and the second pulsed laser light having passed through the wave plate are inputted and which is configured to output in response to the input third pulsed laser light having a fourth wavelength, wherein
the wave plate and the second nonlinear optical crystal are configured such that a beam waist position of the second pulsed laser light falls within a range from a position of the wave plate to a center position of the second nonlinear optical crystal.

13. The wavelength conversion system according to claim 12, wherein
the first and second nonlinear optical crystals are each a CLBO crystal.

14. The wavelength conversion system according to claim 12, wherein
the second wavelength is longer than the first wavelength, the first wavelength is longer than the third wavelength, and the third wavelength is longer than the fourth wavelength.

15. The wavelength conversion system according to claim 14, wherein
the first wavelength is 257.5 nm,
the second wavelength falls within a range from a wavelength longer than or equal to 1549 nm to a wavelength shorter than or equal to 1557 nm,
the third wavelength falls within a range from a wavelength longer than or equal to 220.80 nm to a wavelength shorter than or equal to 220.96 nm, and
the fourth wavelength falls within a range from a wavelength longer than or equal to 193.25 nm to a wavelength shorter than or equal to 193.50 nm.

16. The wavelength conversion system according to claim 12, wherein
the fourth wavelength is produced by sum frequency mixing of the second wavelength with the third wavelength.

17. The wavelength conversion system according to claim 12, wherein
the first and second polarization states are each a state of linearly polarized light having a polarization direction parallel or perpendicular to a plane defined by an optical axis of the corresponding nonlinear optical crystal and an optical path axis of light incident thereon, and the polarization directions in the first and second polarization states are perpendicular to each other.

18. The wavelength conversion system according to claim 12, wherein the first nonlinear optical crystal has a type-1 phase matching condition, and the second nonlinear optical crystal has the type-1 phase matching condition.

19. A method for processing a workpiece, the method comprising exposing the workpiece to laser light outputted from a laser apparatus for exposure apparatus including the wavelength conversion system according to claim 12.

20. The wavelength conversion system according to claim 12, wherein the first nonlinear optical crystal and the second nonlinear optical crystal are configured to satisfy a following relationships: Wa>Wb and Wd>We in a case where Wa represents a beam diameter of the second pulsed laser light to be incident on a light-incident-side end surface of the first nonlinear optical crystal, Wb represents a beam diameter of the second pulsed laser light to be incident on a light-incident-side end surface of the second nonlinear optical crystal, Wd represents a beam diameter of the first pulsed laser light to be incident on the light-incident-side end surface of the first nonlinear optical crystal, and We represents a beam diameter of the first sum frequency light to be incident on the light-incident-side end surface of the second nonlinear optical crystal.

* * * * *